(12) United States Patent
Shiraiwa et al.

(10) Patent No.: US 7,483,256 B2
(45) Date of Patent: Jan. 27, 2009

(54) ELECTROSTATIC CHUCK

(75) Inventors: Norio Shiraiwa, Nagano (JP); Yuichi Hata, Nagano (JP); Naoto Watanabe, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 0 days.

(21) Appl. No.: 11/857,681

(22) Filed: Sep. 19, 2007

(65) Prior Publication Data
US 2008/0080118 A1 Apr. 3, 2008

(30) Foreign Application Priority Data
Sep. 29, 2006 (JP) ............................. 2006-266275

(51) Int. Cl.
*H01L 21/683* (2006.01)
*H01T 23/00* (2006.01)
*H01F 13/00* (2006.01)
*H01H 47/00* (2006.01)
*H01G 7/02* (2006.01)
*H05F 3/00* (2006.01)

(52) U.S. Cl. ...................... 361/234; 361/233; 361/145

(58) Field of Classification Search ......... 361/233–234, 361/145
See application file for complete search history.

(56) References Cited

U.S. PATENT DOCUMENTS
2006/0219363 A1* 10/2006 Matsumoto et al. .... 156/345.47

FOREIGN PATENT DOCUMENTS
JP       2003-324144       11/2003

* cited by examiner

*Primary Examiner*—Stephen W Jackson
*Assistant Examiner*—Dharti H Patel
(74) *Attorney, Agent, or Firm*—Rankin, Hill & Clark LLP

(57) ABSTRACT

An electrostatic chuck includes a base plate, an electrode layer having flexibility, covering the surface of the base plate, and a power supply unit for electrically connecting the electrode layer to the power source side. The power supply unit includes a connection piece including a wire, and electrically conductive components to be used in connection to the power source side. The wire is connected to an electrode of the electrode layer, and extends from the side edge of the electrode layer. The electrically conductive component is electrically connected with the wire, and fixes the connection piece bent along the side surface of the base plate to the base plate.

7 Claims, 5 Drawing Sheets

ELECTROSTATIC CHUCK

This application claims priority to Japanese Patent Application No. 2006-266275, filed Sep. 29, 2006, in the Japanese Patent Office. The priority application is incorporated by reference in its entirety.

TECHNICAL FIELD

The present disclosure relates to an electrostatic chuck for use in electrostatically adsorbing and supporting a work such as a glass substrate or a semiconductor wafer in a process for manufacturing a liquid crystal display apparatus or a product using a semiconductor wafer.

RELATED ART

A liquid crystal display apparatus is formed in the following manner. Two glass substrates with a color filter or a thin film transistor array formed thereon are set with a distance of about several micrometers apart from each other. Then, a liquid crystal is filled between the glass substrates. More specifically, glass substrates are respectively supported on a pair of electrostatic chucks, and then, a liquid crystal is supplied to between the glass substrates, and the glass substrates are bonded to each other while being pressurized.

FIGS. 6A and 6B show an example of such an electrostatic chuck for use in electrostatically adsorbing and supporting a work 5 having a flat plate form such as a glass substrate or a semiconductor wafer. The electrostatic chuck 10 is formed of an electrode layer 11 and a base plate 12 made of a metal such as aluminum. As an inner layer of the electrode layer 11, electrodes 8a and 8b are formed in a prescribed pattern of comb teeth form or the like. The electrodes 8a and 8b are electrically connected to power sources on the plus side and on the minus side, respectively, thus to perform an electrostatically adsorbing action.

Incidentally, in such a case where the glass substrates are bonded to each other with a fine distance of about several micrometers held therebetween as in the case of manufacturing of a liquid crystal display apparatus, a cushioning property is imparted to the work adsorbing surface of the electrostatic chuck. Thus, the deformation of the work can be absorbed, so that the adhesion between the adsorbing surface of the electrostatic chuck and the work is improved. As a result, it is possible to bond the works to each other with a uniform distance, which enables bonding with higher precision.

FIG. 5 shows a configuration of an electrostatic chuck in which a cushioning property has been imparted to the work adsorbing surface of the electrostatic chuck, i.e., the electrode layer 11. In this example, a cushion layer 13 formed of a silicone rubber is provided on a base plate 12. An electrode film layer 14 including an electrode 8 formed therein is bonded to the outer layer of the cushion layer 13. A dielectric layer 15 formed of a resin film such as a polyester film is bonded to the electrode film layer 14 as the outermost layer. Thus, an electrostatic chuck is configured.

Incidentally, in the electrostatic chuck 10 shown in FIGS. 6A and 6B, through holes 6 penetrating through the electrode layer 11 and the base plate 12 along the direction of thickness thereof are provided. Thus, the work 5 can be adsorbed and supported by vacuum adsorption. As shown in FIG. 6A, a ring-like concave groove 6a is provided on the surface of the electrode layer 11, and the plurality of through holes 6 are provided in the concave groove 6a. By roughening the surface of the electrode layer 11, it is possible to vacuum adsorb the work 5 with efficiency. When the work 5 is held by vacuum adsorption, the holding force of the work 5 is reduced under vacuum. Therefore, in that case, the work 5 is held by the electrostatic adsorption force by the electrostatic chuck 10.

[Patent Document 1] Japanese Patent Unexamined Publication No. 2003-324144

Incidentally, in the related-art electrostatic chuck 10 shown in FIG. 5, the power supply unit for connecting the electrode 8 to the power source side is configured as follows. One end of an electric wire 16 is connected via a solder 9 to the electrode 8. The other end of the electric wire 16 is led from a leading hole 12a provided in the base plate 12 to a mounting hole 12b provided in the rear surface side of the base plate 12, and connected to electrically conductive components 17a and 17b disposed in the mounting hole 12b. The electrically conductive components 17a and 17b are mounted in such a manner as to be electrically insulated with respect to the base plate 12 by an insulator 19. The electrically conductive components 17a and 17b are in contact with the electrode terminal on the power source side, so that the power source and the electrode 8 are electrically connected.

In the leading hole 12a, a silicone adhesive 18 is filled, so that the electric wire 16 is fixed in the leading hole 12a in such a manner as to be electrically insulated with respect to the base plate 12. However, as described above, the electrode layer 11 has a cushion property. For this reason, when a work is supported or a work is pressurized by the electrostatic chuck, the electrode layer 11 is deformed, so that a stress acts between the electrode 8 and the power supply unit. As a result, unfavorably, the electrode 8 and the electric wire 16 undergo conduction breakage, or the electrical insulation by the silicon adhesive 18 becomes insufficient, which causes discharge between the base plate 12 and the electric wire 16.

Further, in the case where a work is vacuum adsorbed on the electrostatic chuck 10, discharge unfavorably occurs in vacuum when the vacuum sealing property between the silicone adhesive 18 and the leading hole 12a is insufficient. Whereas, when bubbles enters the silicon adhesive 18 upon filling the leading hole 12a with the adhesive, the bubbles expand under vacuum, so that the electrode layer 11 swells at the portion of the leading hole 12a. As a result, unfavorably, the work is not adsorbed and supported with accuracy.

SUMMARY

Exemplary embodiments of the present invention provide an electrostatic chuck which is capable of holding the electrical connection with the power supply unit for connecting the electrode of the electrode layer covering the base plate and the power source with reliability, and is capable of adsorbing and supporting the work with reliability even when the adsorbing surface of the electrostatic chuck has a cushion property, and is excellent in durability.

An electrostatic chuck according to one or more embodiments of the present invention includes a base plate, an electrode layer having flexibility, covering the surface of the base plate, and a power supply unit for electrically connecting the electrode layer to a power source side. In the electrostatic chuck, the power supply unit includes: a connection piece including a wire, which is connected to an electrode of the electrode layer and extends from a side edge of the electrode layer, and an electrically conductive component to be used in connection to the power source side, which is electrically connected with the wire, and fixes the connection piece bent along the side surface of the base plate to the base plate.

Further, the electrically conductive component is mounted in a mounting hole opening in a rear surface of the base plate provided in the base plate, and the connection piece is inserted into a connection hole opening in the side surface of the base plate in such a manner as to communicate with the mounting hole. The wire is attached in such a manner as to be electrically connected to the electrically conductive component in the mounting hole. As a result, the wire provided in the connection piece and the electrically conductive component are electrically connected to each other with reliability.

Whereas, when the base plate is made of an electrically conductive material, by mounting an insulator in the mounting hole, it is possible to mount the electrically conductive component in such a manner as to be electrically insulated with respect to the base plate.

Further, the connection hole is sealed by an adhesive with the connection piece inserted into the connection hole. As a result, it is possible to ensure the connection reliability of the connection part between the power supply unit and the electrode.

Still further, the connection piece is bent from the side surface of the base plate onto the rear surface of the base plate, and compressed by the electrically conductive component fixed on the rear surface of the base plate between the electrically conductive component and the rear surface of the base plate, such that the electrically conductive component and the wire are electrically connected and supported. As a result, the wire provided in the connection piece and the electrically conductive component are electrically connected to each other with reliability.

Furthermore, it is a feature that the electrically conductive component is provided as a connector fixed and attached on the rear surface of the base plate.

Further, it is a feature that the electrode layer includes a cushion layer deposited on the surface of the base plate, an electrode film layer covering the outer surface of the cushion layer, and a dielectric layer covering the outer surface of the electrode film layer, and the connection piece is formed in such a manner as to extend from the side edges of the electrode film layer and the dielectric layer. In accordance with the electrostatic chuck according to the present invention, even when the work adsorbing surface has a cushion property, the electrical connection between the wire formed in the electrode layer and the electrically conductive component is ensured.

Further, the connection piece is provided in such a manner that at a site at which the electrically conductive component and the wire are connected, the dielectric layer covering the electrode film layer is removed, and the wire is exposed. As a result, the electrical connection between the wire and the electrically conductive component is accomplished with ease.

In accordance with the electrostatic chuck according to the invention, the power supply unit for connecting the power source and the electrode provided in the electrode layer is configured as follows. The connection piece extending from the electrode layer is bent along the side of the base plate to be connected to an electrically conductive component. Therefore, even when a work is adsorbed on the adsorbing surface of the electrostatic chuck, a stress will not act on between the electrode and the power supply unit. As a result, it is possible to hold the electrical connection between the electrode and the power supply unit with reliability. Even when the adsorbing surface of the electrostatic chuck has a cushion property, action of a stress on the connection part between the electrode and the power supply unit is avoided. This ensures the electrical connection between the electrode and the power supply unit. As a result of this, the durability of the electrostatic chuck is improved.

Other features and advantages may be apparent from the following detailed description, the accompanying drawings and the claims.

DETAILED DESCRIPTION

Below, the preferred embodiments of the present invention will be described in details by reference to the accompanying drawings.

First Embodiment

Figure 1:
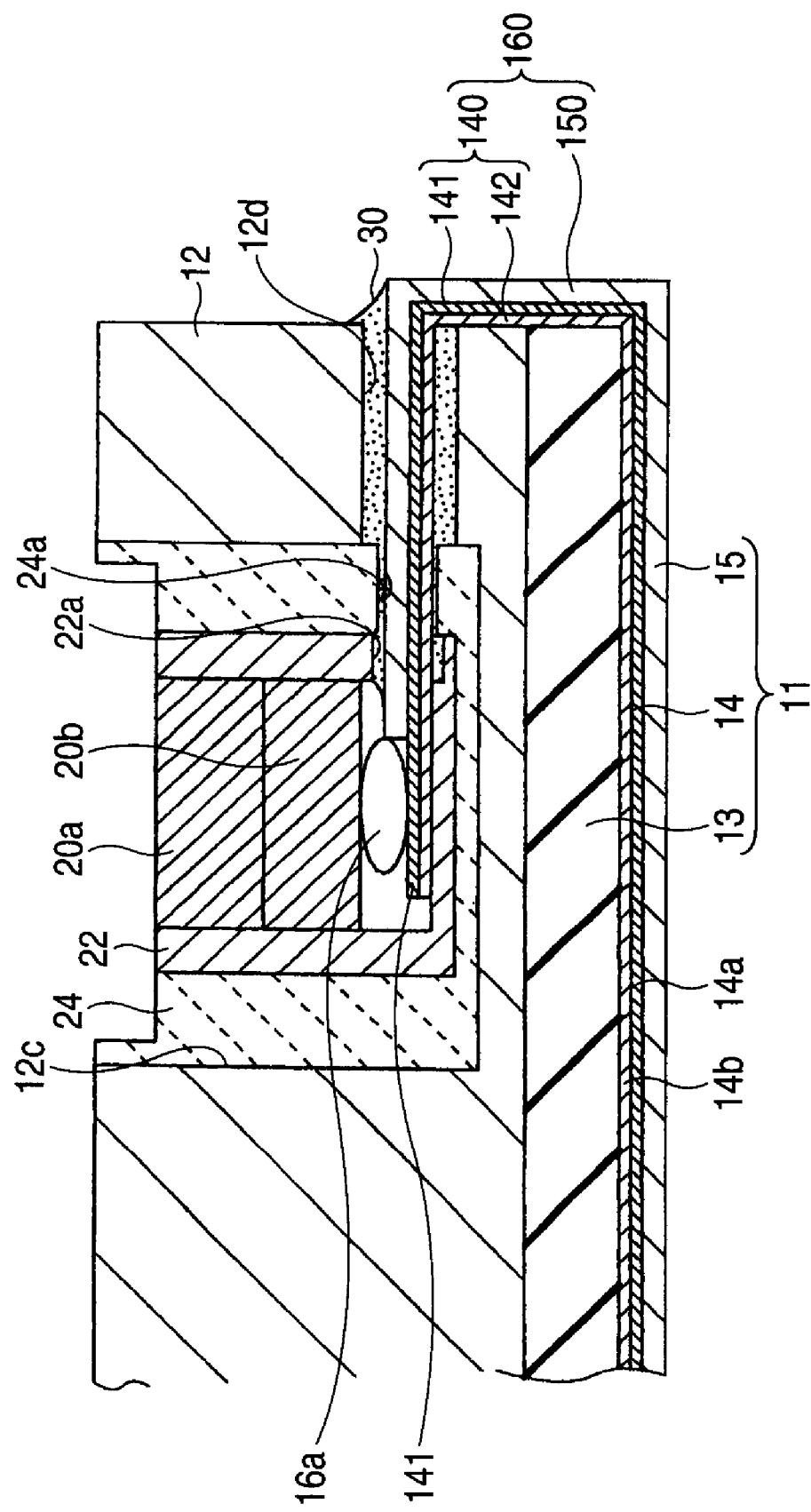
FIG. 1 is a cross sectional view showing a configuration of a first embodiment of an electrostatic chuck.

FIG. 1 is a cross sectional view showing a configuration of a first embodiment of an electrostatic chuck in accordance with the present invention. The electrostatic chuck of this embodiment is formed of an electrode layer 11 having a cushion property and a base plate 12 as with the related-art electrostatic chuck shown in FIG. 5. The base plate 12 is formed of aluminum.

The electrode layer 11 includes a cushion layer 13 covering the absorbing surface of the base plate 12, an electrode film layer 14 covering the outer surface of the cushion layer 13, and a dielectric layer 15 covering the outer surface of the electrode film layer 14.

For the cushion layer 13, a material having cushion property such as silicone rubber or urethane rubber can be used so that the work adsorbing surface of the electrostatic chuck has a prescribed cushion property. In this embodiment, a silicon rubber with a thickness of 5 mm was used.

The electrode film layer 14 is configured such that an electrode 14a is formed in a prescribed pattern on one side of a base film 14b. For the base film 14b, a polyimide film with a thickness of 50 μm was used. On one side of the polyimide film, an electrically conductive film made of Cu or ITO (Indium Tin Oxide) was formed, resulting in the electrode 14a. The electrically conductive film can be formed by CVD, PVD, sputtering, or thermal spraying. The thickness of the electrically conductive film is set to be about 5 to 18 μm. When the thickness of the electrically conductive film is set too large, the difference in level due to the presence or absence of the electrically conductive film becomes large. Therefore, this is not preferable.

The electrode 14a is formed in a prescribed pattern such as a comb teeth pattern or a block pattern. The electrode 14a is formed in individually independent patterns wherein a pattern to be applied with a plus voltage and a pattern to be applied with a minus voltage are individually formed and are connected to the plus-side power source and the minus-side power source, respectively.

When the electrode film layer 14 is laminated on the cushion layer 13 in a state that the base film 14b faces the cushion layer 13. The surface, which faces the cushion layer 13, of the electrode film layer 14 is opposite to that in the case of FIG. 5.

For the dielectric layer 15, the film material and thickness are selected in view of the electrostatic adsorption action and the withstand voltage. In this embodiment, a polyester film with a thickness of 75 µm was used. By using a polyester film with a thickness of 12 µm to 300 µm, it is possible to apply a direct current voltage of 500 V to 10000 V for obtaining a sufficient adsorption force.

When the electrode layer 11 is attached to the base plate 12, the dielectric layer 15 and the electrode film layer 14 are bonded to form a lamination. The lamination is bonded to the cushion layer 13 to form the electrode layer 11. Then, the electrode layer 11 is bonded to the base plate 12.

Figure 5:
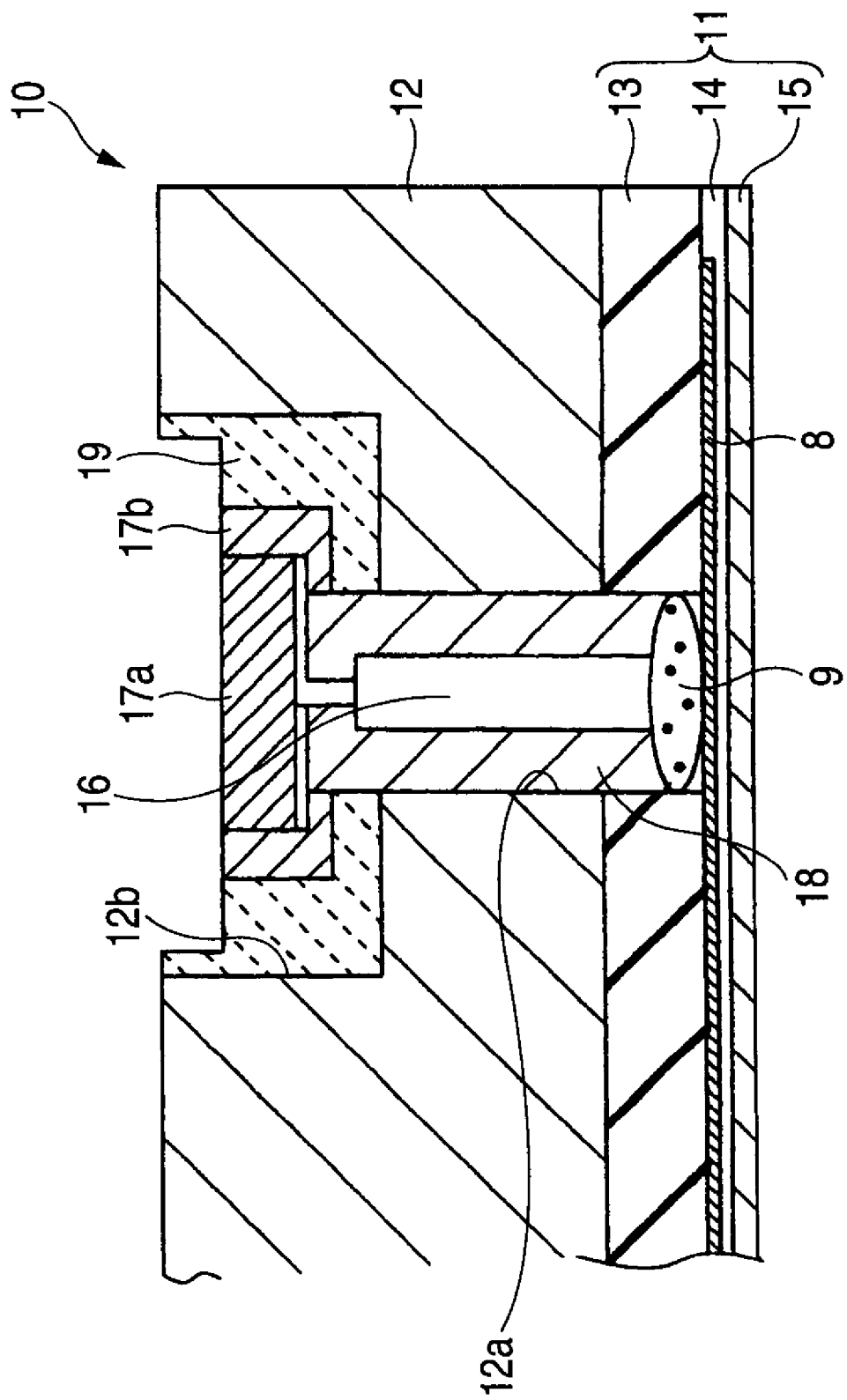
FIG. 5 is a cross sectional view showing a related-art configuration of the electrostatic chuck.
Figure 6A:
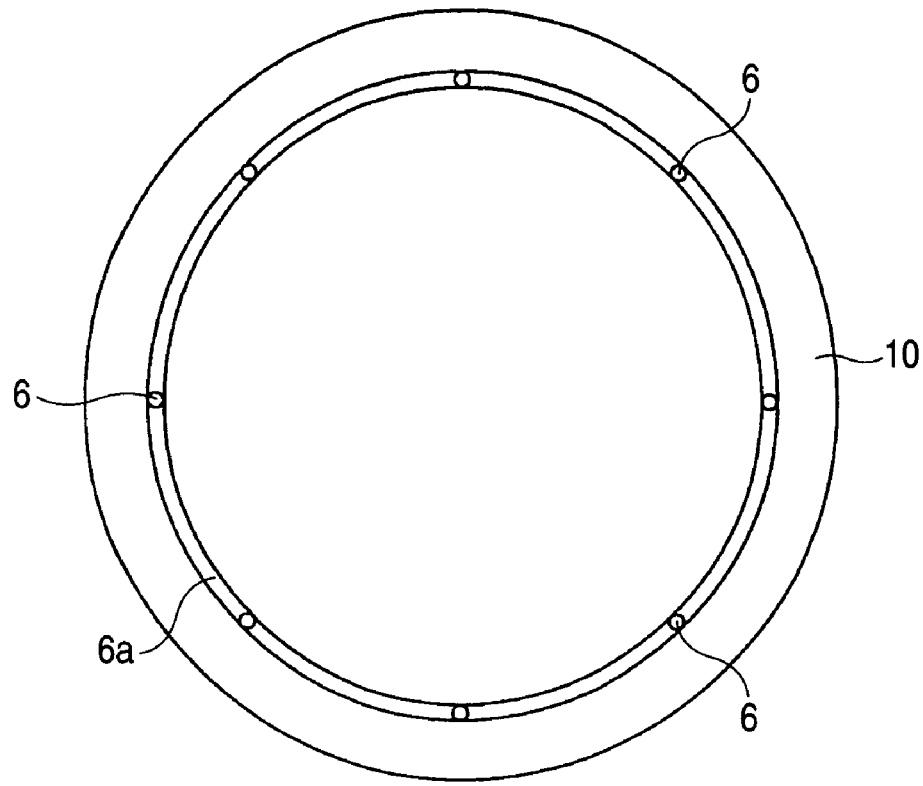
FIG. 6A is a plan view showing the configuration of the electrostatic chuck.
Figure 6B:
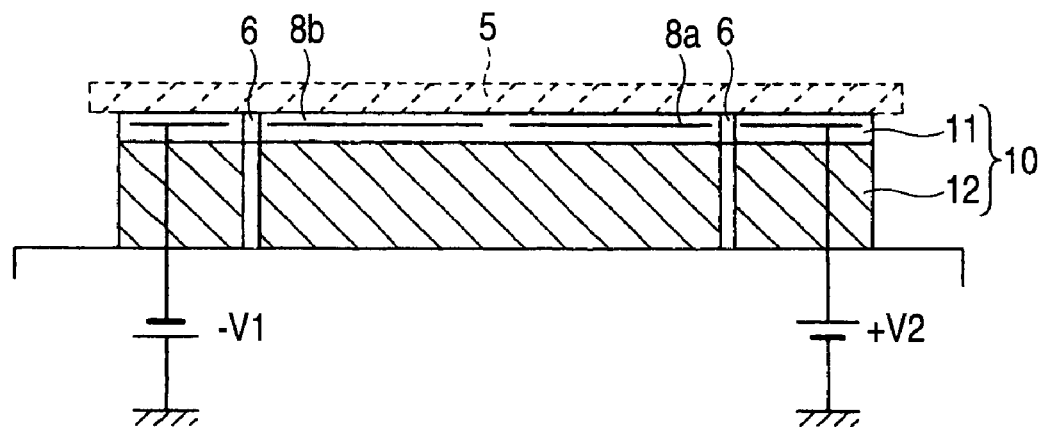
FIG. 6B is a cross sectional view showing the configuration of the electrostatic chuck.

The characteristic configuration in the electrostatic chuck of this embodiment is the structure of the power supply unit provided in the electrostatic chuck for connecting the electrode 14a formed in the inner layer of the electrode layer 11 and the power source side. On the rear surface side of the base plate 12, there are disposed electrically conductive components which come in contact with an electrode terminal on the power source side to ensure electric conduction. These electrically conductive components are regulated on the arrangement positions in alignment with the arrangement of the electrode terminal of a power source apparatus, which is electrically connected with the electrostatic chuck upon mounting of the electrostatic chuck, and applies a high voltage to the electrode 14a. The electrically conductive components 17a and 17b shown in FIG. 5 are also arranged in alignment with the arrangement of the electrode terminal.

In this embodiment, the following configuration is adopted. A mounting hole 12c opening in the rear surface of the base plate 12 is provided in alignment with the arrangement of the electrode terminal on the power source side. In the mounting hole 12c, there are mounted disc-like electrically conductive components 20a and 20b, a tube-like electrically conductive component 22, into which the electrically conductive components 20a and 20b are inserted, and an insulator 24 formed in a bottomed tube. Further, a connection hole 12d communicating with the mounting hole 12c is provided such that one end thereof opens in the side surface of the base plate 12. To the connection hole 12d, a connection piece 160 extending from the side edges of the electrode film layer 14 and the dielectric layer 15 is inserted. A wire 141 provided in an electrode film piece 140 is electrically connected with the electrically conductive components 20a and 20b. In the side surfaces on the bottom side of the electrically conductive component 22 and the insulator 24, communication holes 22a and 24a into which the connection piece 160 is inserted are provided at the positions communicating with the connection hole 12d.

The connection piece 160 includes the electrode film piece 140 and a dielectric film 150 provided in such a manner as to extend with a narrow width from the side edges at which end portions of the electrode film layer 14 and the dielectric layer 15 are terminated. The electrode film piece 140 is provided with the wire 141 to be electrically connected with the plus pole or minus pole electrode 14a provided in the electrode film layer 14. The wire 141 is protected by a base film 142 of the electrode film piece 140 and the dielectric film 150 so as not to be exposed to the outside. However, at the tip portion of the connection piece 160, the dielectric film 150 is removed, and a solder 16a is bonded to the surface of the wire 141.

As shown in FIG. 1, the connection piece 160 is bent along the side surface of the base plate 12. The tip of the connection piece 160 is inserted from the connection hole 12d, and inserted through the communication holes 24a and 22a to the inside of the electrically conductive component 22. Next, the electrically conductive components 20a and 20b are inserted into the electrically conductive component 22. Then, the underside of the electrically conductive component 20b is brought in contact with the solder 16a and fixed.

This ensures an electrical connection between the electrically conductive components 20a and 20b to be connected to the power source side and the electrode 14a of the electrode layer 11 via the wire 141. The wire 141 is protected by the dielectric film 150 and the base film 142. Thus, the wire 141 can establish an electrical insulation with respect to the base plate 12 with the connection piece 160 bent along the side surface of the base plate 12, and inserted into the connection hole 12d.

In this embodiment, the connection piece 160 mounted with being bent along the side surface of the base plate 12, and the electrically conductive components 20a and 20b mounted in the mounting hole 12c form the power supply unit for the electrode 14a.

Figure 2:
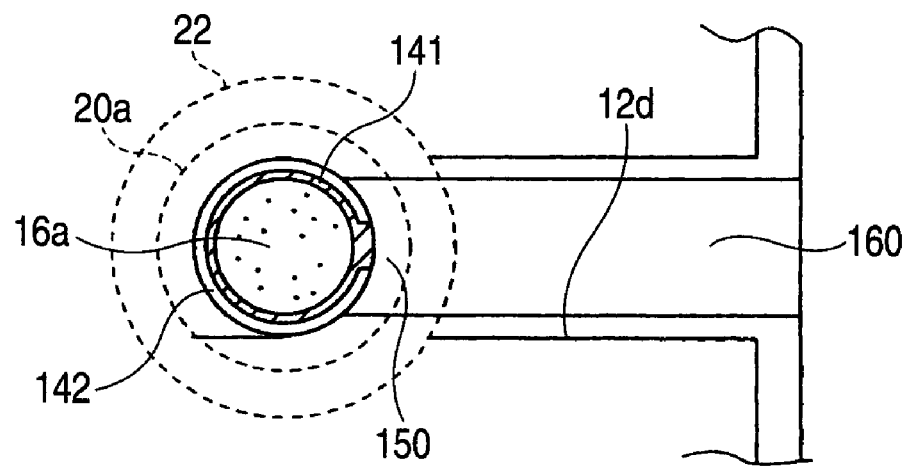
FIG. 2 is a plan view showing a configuration of a connection part between a connection piece and an electrically conductive component.

FIG. 2 shows a plan configuration in a state in which the connection piece 160 is inserted into the connection hole 12d, and the electrically conductive component 20a and the wire 141 are connected. The connection piece 160 formed in a strip is inserted to under the electrically conductive component 20a. A portion of the dielectric film 150 is removed at the tip of the connection piece 160, so that the wire 141 formed on the surface of the base film 142 is exposed, and the solder 16a is bonded to the exposed portion of the wire 141.

Incidentally, the solder 16a is used as a conductive material for electrically connecting the wire 141 and the electrically conductive component 20b. Other conductive material such as an electrically conductive adhesive than a solder can also be used.

After connecting the electrically conductive components 20a and 20b and the wire 141, a silicon adhesive 30 is potted into the connection hole 12d. Thus, the connection hole 12d is sealed with the silicon adhesive 30.

Figure 3:
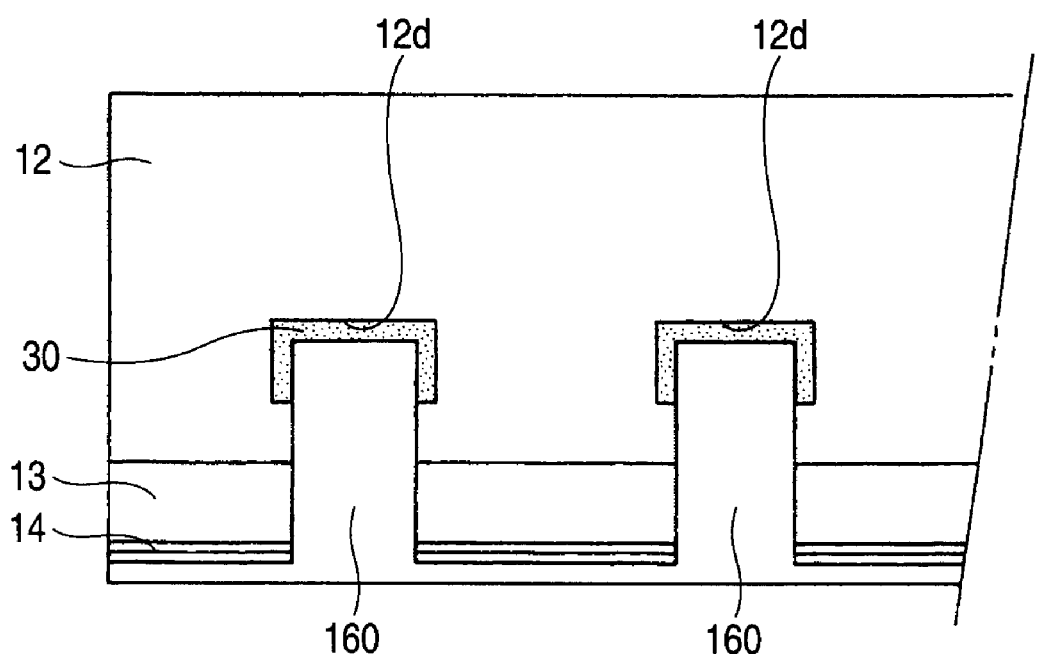
FIG. 3 is a front view of the state in which the connection piece is mounted in a connection hole.

FIG. 3 shows a state in which the connection hole 12d is sealed with the silicone adhesive 30, seen from the direction of the side surface of the base plate 12. In FIG. 3, there is shown a state in which the connection pieces 160 are respectively inserted into two connection holes 12d, and sealing is carried out with the silicone adhesive 30.

In the electrode layer 11, a plus electrode and a minus electrode are formed. Therefore, connection piece 160 is formed for each of these electrodes. The wire to be connected to the electrode is formed for each connection piece 160. Thus, respective connection pieces 160 are respectively connected to the electrically conductive components in individually formed mounting holes. According to the plan pattern of the electrode 14a formed in the electrode layer 11, in some cases, two or more connection pieces 160 must be provided for the electrode on the plus pole side or on the minus pole side to be connected to the power source side. In that case, it is essential only that individual connection pieces 160 are individually connected to the electrically conductive components. The configuration for connecting the connection pieces 160 and the electrically conductive components (configuration of the power supply unit) may be precisely the same as the foregoing method. Incidentally, in this embodiment, the connection hole 12d is formed in a rectangle in cross section, but it may also be formed in a circle.

Incidentally, when the connection piece 160 is bent at the side surface of the base plate 12, it may be configured such that the connection piece 160 sags. If it is configured such that the connection piece 160 sags slightly, deformation can be absorbed with ease even when the electrode layer 11 as the adsorption surface of the electrostatic chuck is compressed and deformed.

Whereas, the electrostatic chuck of this embodiment has a configuration in which the connection piece 160 is bent at the side surface of the base plate 12 to be connected to the electrically conductive components 20a and 20b. Therefore, in the case where a work is adsorbed on the work adsorbing surface of the electrostatic chuck, a stress will not reach the connection part between the wire 141 and the electrically conductive components 20a and 20b. This can prevent the occurrence of conduction breakage at the connection part between the electrode and the power supply unit.

Further, a stress thus does not act on the silicone adhesive 30 firming and protecting the connection part between the electrode and the power supply unit. As a result of this, the electrical insulation by the silicone adhesive 30 is held with reliability, which prevents discharge from occurring between the base plate 12 and the power supply unit. This ensures the connection reliability. Further, the vacuum sealing property by the silicone adhesive 30 is improved. This prevents discharging from occurring in vacuum when a work is vacuum adsorbed on the electrostatic chuck. Whereas, even when bubbles enter the silicon adhesive 30, in the case of this embodiment, the electrode layer 11 will not swell on the work adsorbing surface in terms of the configuration. This can solve the problem that the electrostatic chuck becomes incapable of adsorbing a work with accuracy.

Second Embodiment

Figure 4:
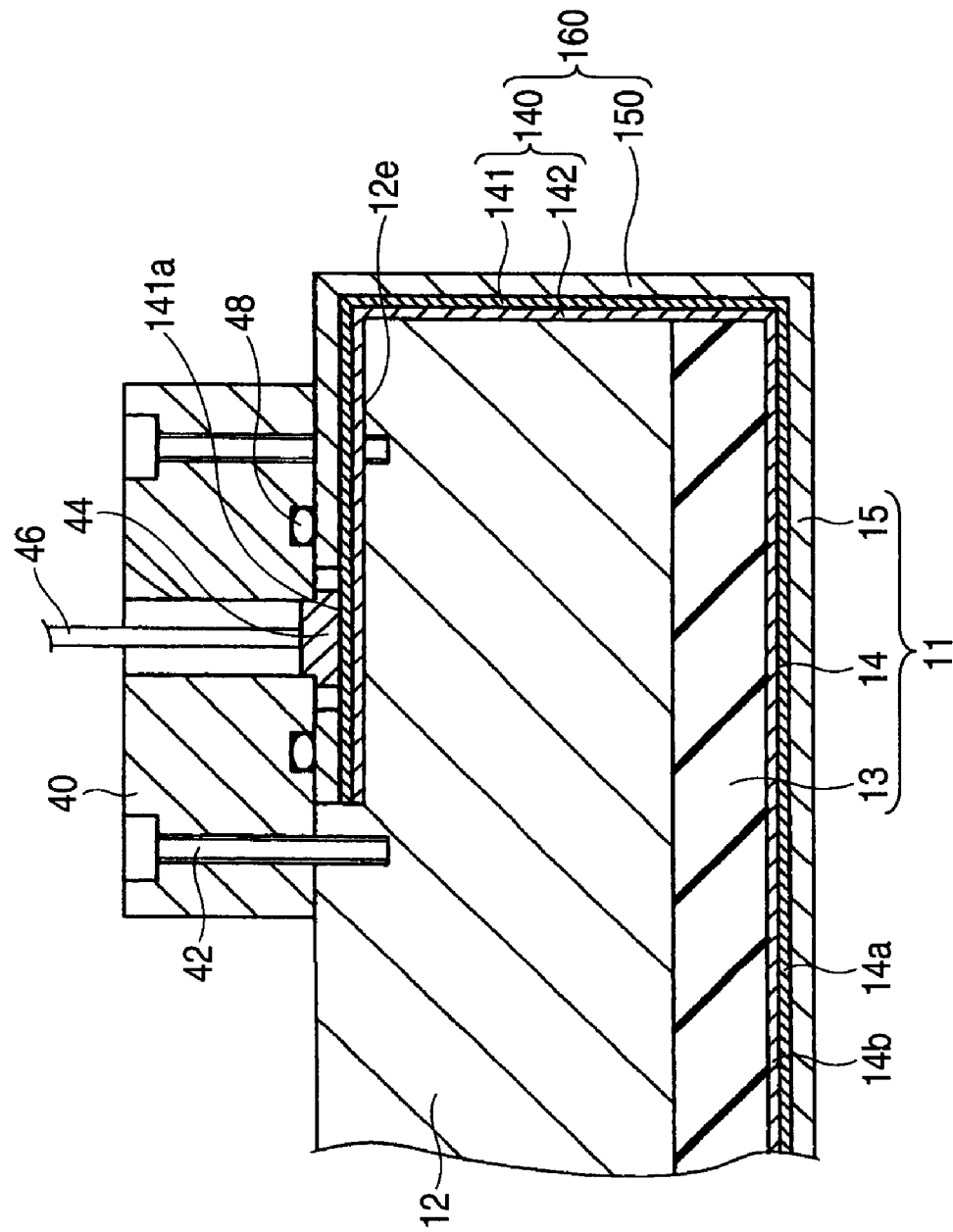
FIG. 4 is a cross sectional view showing a configuration of a second embodiment of the electrostatic chuck.

FIG. 4 is a cross sectional view showing a configuration of a second embodiment of the electrostatic chuck in accordance with the invention. The electrostatic chuck of this embodiment has the following feature. A connector 40 to be electrically connected to the power source side is disposed on the rear surface of the base plate 12. Thus, a connection piece 160 extending from the side edge of the electrode layer 11 is connected to the connector 40, so that a wire 141 formed in the connection piece 160 is electrically connected to the power supply unit.

The configuration of the electrode layer 11 arranged on the adsorbing surface of the base plate 12 is precisely the same as with First Embodiment. Further, the configuration of the connection piece 160 extending from the electrode layer 11 is also the same as the configuration in First Embodiment.

In this embodiment, the connector 40 is attached to the rear surface of the base plate 12. Therefore, the connection piece 160 passes through the side surface of the base plate, and bent back to the rear surface side of the base plate 12 for use.

At the position at which the connection piece 160 at the rear surface of the base plate 12 is bent, a step 12e matched to the thickness of the connection piece 160 is formed. The connection piece 160 is bent at the step 12e, and the connector 40 is fixed to the base plate 12 by a bolt 42. As a result, the connection piece 160 is compressed and supported between the connector 40 and the rear surface of the base plate 12.

In this embodiment, the connector 40 is formed of an insulation material. The electrical connection between the wire 141 formed in the connection piece 160 and the power source side is established in the following manner. When the connector 40 is fixed on the base plate 12, a contact block 44 as an electrically conductive component provided on the underside of the connector 40 so as to project toward the connection piece 160 is pressed and brought in contact with the wire 141 formed in the connection piece 160. In the connection piece 160, a portion of the dielectric film 150 at the site to be in contact with the contact block 44 is previously removed to expose the wire 141, thereby forming a connection part 141a.

An electrically conductive wire 46 is connected to the contact block 44, and the edge of the electrically conductive wire 46 is led to the outside of the connector 40, and connected to the power source side. In this embodiment, the main body of the connector 40 is formed of an insulator. However, the main body of the connector 40 can also be formed of an electrically conductive material such as a metal. In that case, the contact block 44 to be in contact with the wire 141 may be attached in such a manner as to be insulated with respect to the main body.

Further, in this embodiment, the following configuration was adopted. On the surface of the connector 160 to be in contact with the connection piece 160, an O ring 48 is mounted at a disposition surrounding the contact block 44. Thus, the connection part between the wire 141 and the power supply unit is vacuum sealed. As a result of this, it is possible to ensure the vacuum sealing property of the connection part when a work is vacuum adsorbed on the electrostatic chuck. In addition, it is possible to ensure the electrical connection between the connector 40 and the wire 141 formed in the connection piece 160.

In this embodiment, the connection between the wire 141 formed in the electrode layer 11 and the connector 40 attached to the base plate 12 is established at the rear surface of the base plate 12 to which the connection piece 160 is bent along the side surface of the base plate 12. For this reason, even when the electrode layer 11 has a cushion property, a stress will not act on the connection part between the electrode and the power supply unit, which prevents the occurrence of conduction breakage at the connection part between the electrode and the power supply unit. Further, even when a work is vacuum adsorbed on the adsorbing surface, a stress will not act on the connection part. Thus, a problem that discharge occurs in vacuum is not caused.

Further, in the case of this embodiment, an adhesive is not used for the purposes of vacuum sealing and electrical insulation of the connection part between the electrode and the power supply unit. Therefore, it is possible to solve such a problem as the deformation of the adsorbing surface due to expansion of bubbles mixed in the adhesive upon vacuum adsorption.

What is claimed is:

1. An electrostatic chuck, comprising:
 a base plate;
 an electrode layer having flexibility, covering a surface of the base plate, having an electrode; and
 a power supply unit connected to the electrode layer,
 wherein the power supply unit includes
  a connection piece being disposed along a side surface of the base plate and including a wire, the wire being connected to the electrode of the electrode layer and extending from a side edge of the electrode layer, and
  an electrically conductive component which is electrically connected with the wire, and fixes the connection piece to the base plate,
 wherein the electrode layer includes a cushion layer deposited on the surface of the base plate, an electrode film layer covering the outer surface of the cushion layer and having the electrode, and a dielectric layer covering the outer surface of the electrode film layer, and wherein the connection piece includes an electrode film piece and a dielectric film, which are formed in such a manner as to extend from side edges of the electrode film layer and the dielectric layer, the electrode film piece having the wire connected to the electrode of the electrode film layer.

2. The electrostatic chuck according to claim 1, wherein the electrically conductive component is mounted in a mounting hole opening in a rear surface of the base plate, wherein the connection piece is inserted into a connection hole opening in the side surface of the base plate, the connection hole communicating with the mounting hole, and wherein the wire is electrically connected to the electrically conductive component in the mounting hole.

3. The electrostatic chuck according to claim 2, wherein the base plate is made of an electrically conductive material, and wherein the electrically conductive component is mounted in the mounting hole in such a manner as to be electrically insulated with respect to the base plate by an insulator mounted in the mounting hole.

4. The electrostatic chuck according to claim 2, wherein the connection hole is sealed by an adhesive with the connection piece inserted into the connection hole.

5. The electrostatic chuck according to claim 1, wherein the connection piece is bent from the side surface of the base plate onto a rear surface of the base plate, and compressed by the electrically conductive component fixed on the rear surface of the base plate between the electrically conductive component and the rear surface of the base plate, such that the electrically conductive component and the wire are electrically connected and supported.

6. The electrostatic chuck according to claim 5, wherein the electrically conductive component includes a connector fixed and attached on the rear surface of the base plate.

7. The electrostatic chuck according to claim 1, wherein the dielectric film covering the electrode film piece at a site at which the electrically conductive component and the wire are connected is removed to expose the wire.

\* \* \* \* \*